(12) United States Patent
Charbonnier

(10) Patent No.: US 6,467,383 B1
(45) Date of Patent: Oct. 22, 2002

(54) MACHINE FOR PUNCHING PANELS

(75) Inventor: Serge Charbonnier, Chambray (FR)

(73) Assignee: Automa-Tech, Valde Reuil (FR)

( * ) Notice: Subject to any disclaimer, the term of this patent is extended or adjusted under 35 U.S.C. 154(b) by 0 days.

(21) Appl. No.: 09/688,447

(22) Filed: Oct. 16, 2000

(30) Foreign Application Priority Data

Oct. 29, 1999 (FR) .......................................... 99 13573

(51) Int. Cl.[7] ................................................ B26D 5/00
(52) U.S. Cl. ...................... 83/76.6; 83/559; 83/929.1; 83/211; 83/213; 83/266; 83/368; 83/631
(58) Field of Search ............................... 83/929.1, 211, 83/212, 213, 255, 266, 76.6, 76.7, 76.8, 368, 371, 520, 522.26, 631, 640, 34, 36, 481, 559

(56) References Cited

U.S. PATENT DOCUMENTS

| | | | | |
|---|---|---|---|---|
| 4,523,749 A | * | 6/1985 | Kindgren et al. | 269/32 |
| 4,696,211 A | * | 9/1987 | Bitzel | 83/49 |
| 4,790,694 A | * | 12/1988 | Wilent et al. | 83/71 |
| 4,869,141 A | * | 9/1989 | Klingel | 83/49 |
| 5,027,683 A | * | 7/1991 | Kakimoto | 83/76.6 |
| 5,794,526 A | * | 8/1998 | Raney | 83/34 |
| 5,970,832 A | * | 10/1999 | Aizawa | 83/76.1 |
| 5,970,836 A | * | 10/1999 | Sorel et al. | 83/481 |
| 6,013,017 A | * | 1/2000 | Aizawa | 83/559 |
| 6,145,424 A | * | 11/2000 | Matsuda et al. | 83/227 |
| 6,279,445 B1 | * | 8/2001 | Rosene et al. | 83/698.91 |

FOREIGN PATENT DOCUMENTS

| | | |
|---|---|---|
| EP | 0 367 185 | 5/1990 |
| EP | 0 819 504 | 1/1998 |

* cited by examiner

Primary Examiner—M. Rachuba
(74) Attorney, Agent, or Firm—O'Melveny & Myers LLP

(57) ABSTRACT

The invention relates to a punch machine for punching a panel in which the position of each hole to be made is identified by a mark. The machine comprises a structure for receiving said panel, said structure presenting X and Y directions; means for holding said panel relative to the structure; at least four punch blocks secured to a support, each punch block having at least one punch carrier tool and at least one matrix carrier assembly; means for displacing each punch block separately in the X and Y directions and in rotation; optical means for comparing the position of each punch block with said mark; and means for separately controlling the displacement means in response to position error information.

10 Claims, 5 Drawing Sheets

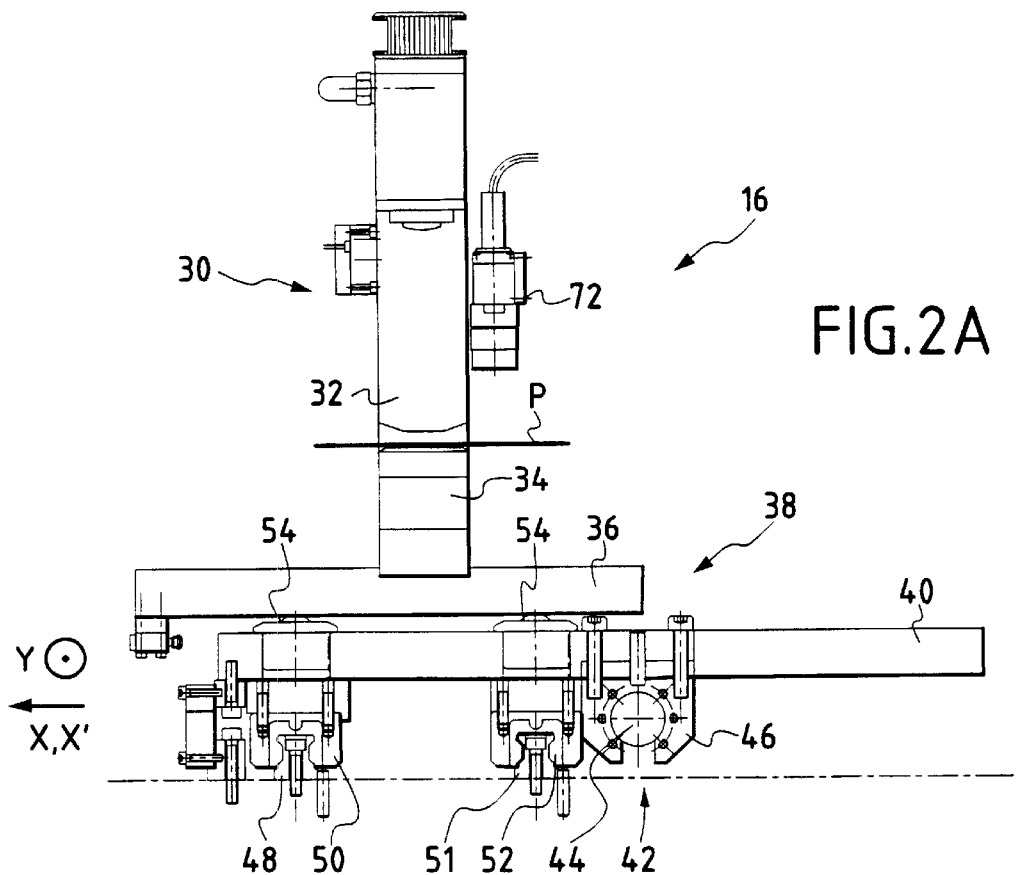
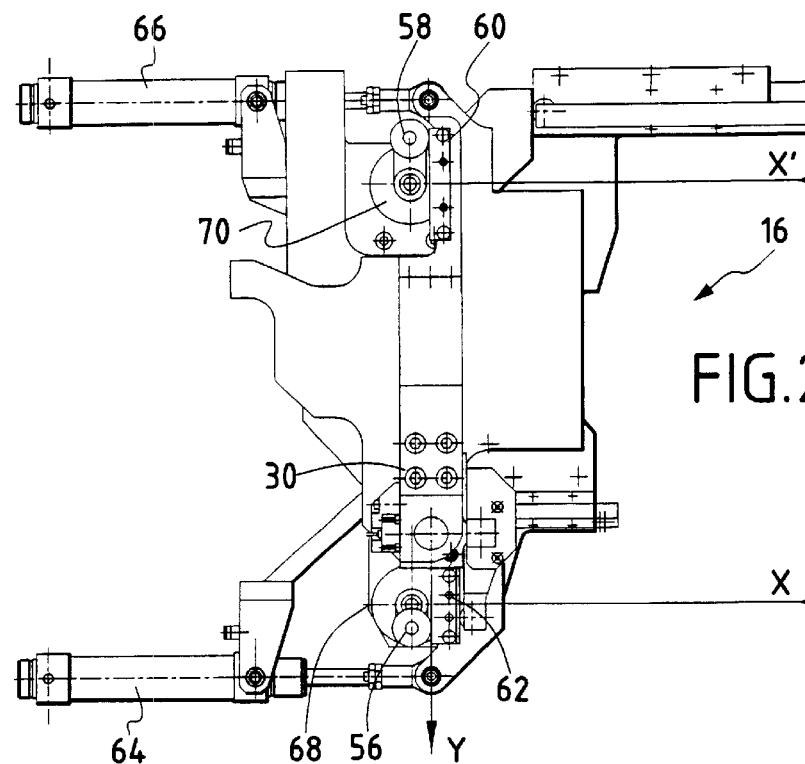

MACHINE FOR PUNCHING PANELS

The present invention relates to a machine for punching panels and in particular printed circuit panels.

BACKGROUND OF THE INVENTION

More and more items of equipment are making use of printed circuits that are becoming ever more complex. To solve this problem, it is common place to use multilayer printed circuits. Such multilayer circuits consist in making some number of individual printed circuit plates or panels which are then fixed together and electrical connections are also made between the various layers so as to obtain a complete multilayer printed circuit.

When making the complete circuit, it is naturally necessary to stack the individual printed circuits with great precision in order to succeed in making the final circuit, so it is essential to provide position-marker means in each of the individual printed circuits. This marking is usually performed by means of holes formed through the insulating backing of the printed circuit at locations that are well defined relative to the panel and/or the printed circuit made on the panel.

In addition, it is well known that for reasons of economy, the various steps involved in the manufacture of a printed circuit need to be performed using machines that operate automatically.

European patent application 0 819 504 describes a punching machine which can be fed automatically, which enables the printed circuit plate to be positioned relative to the structure of the machine, and which finally makes it possible to put the various punches of the machine into place so as to make the holes in the desired locations. Nevertheless, in that machine, the final positioning of the holes by punching is obtained with high precision only by means of an initial stage during which the printed circuit panel is positioned relative to the structure of the machine using a table that can be moved in X and Y directions and in rotation. Once the printed circuit panel has been positioned with precision relative to the structure, it is then held stationary by mechanical means. Also, in that machine, the purpose of moving the punches is merely to adapt the machine to printed circuit panels of different dimensions and to the different positions for the reference holes that are to be made in the panels.

In certain types of manufacture, it is found that positioning the printed circuit panel relative to the machine can take up a non-negligible length of time, in particular because of the large dimensions of the panel to be positioned. Further, while the punching operation is being performed, the panel must be held with very great precision while simultaneously avoiding any risk of bending the panel since that would spoil the precision with which the hole is positioned. Unfortunately, it is naturally necessary to have access to both faces of the panel so as to be able to place on opposite sides thereof firstly the punch proper and secondly the die which is associated with the punch.

In addition, positioning holes are often of a shape which is not circular, but which can be oblong so as to provide a better position reference. It is therefore necessary for the machine to be capable not only of making holes in the desired locations, but also for it to be capable of making holes that are non-circular and for these holes to be correctly oriented relative to the panel.

Furthermore, in order to enable such machines to be automated, it is necessary for them to be fed using automatic transfer means.

Finally, the positioning holes must be capable of being made at any point of a panel, and in particular in the center of each side of the panel. This ability must not give rise to the punch block being capable of displacement through an amplitude that is excessive.

The resulting cantilevered-out configuration would run the risk of being prejudicial to the precision with which the punch is finally positioned.

OBJECTS AND SUMMARY OF THE INVENTION

An object of the present invention is to provide a machine for punching a panel, and in particular a printed circuit panel, which mitigates the drawbacks of prior art machines while enabling the operating throughput of the machine to be increased, in particular by simplifying the final positioning operations performed between the panel and the punch tools.

To achieve this object, the invention provides a machine for punching a panel on which the position of each hole to be made is identified by a mark, at least some of the holes being capable of having an outline that is not circular, the machine comprising:

- a structure for receiving said panel, said structure presenting X and Y directions;
- transfer means for bringing a panel onto said structure in the X direction;
- means for holding said panel relative to the structure;
- at least four punch blocks, each block being secured to a support, each punch block comprising at least one punch carrier tool and at least one die carrier assembly, the support for two of said blocks being in the form of a gantry to enable said panels to travel in the X direction between said punch carrier tool and said matrix carrier assembly of said two punch blocks;
- displacement means for separately moving each punch block relative to the structure in the X and Y directions and in rotation;
- optical comparator means for comparing the position of each punch block with the corresponding mark and for generating X and Y and rotation position error information relating to each punch block; and
- control means for separately controlling the displacement means in response to the position error information.

It will be understood that in the invention the panel is fixed relative to the structure after it has been prepositioned, and that it is the punch blocks which are positioned with precision in the X and Y directions and in rotation in order to make holes at the intended locations on the panel and to make holes with the desired orientations. It can thus be seen that since the panel is fixed relative to the structure, it is possible to provide means for preventing the panel from moving relative to the structure which are more effective and simpler since these means for holding the panel stationary are themselves functionally fixed relative to the structure.

In addition, the fact that the supports for the punch blocks of at least two of the punch blocks are in the form of a gantry means that the panels can pass between the punch and the die when feeding a panel to the machine and when removing a panel therefrom after the holes have been made.

It will also be understood that, while the machine is being fed with panels, the punch blocks can be prepositioned before final positioning by prior detection of marks that represent the positions of the holes and that are made on the panels.

Preferably, the optical comparator means comprise a camera secured to each punch block.

In this preferred embodiment, the fact that the camera is secured to the punch block and that the block is itself prepositioned means that the camera need have only a small field of view, thereby giving an image that is more precise.

In addition, after a hole has been made by a punch tool, it is possible to use the camera to measure and store any error within allowed tolerances between the actual position of the hole made and the corresponding mark on the printed circuit panel. By calculating the mean error for all of the holes made in succession by the same tool, it is possible on the basis of said mean value to correct the displacement instructions that are transmitted by the central calculator of the machine to the punch block.

This operation which is itself made possible by having precise control over the positioning of each punch block in the X and Y directions and in rotation, makes it possible in turn to escape from the cumulative effect of manufacturing tolerances concerning the various parts of the punch tools.

BRIEF DESCRIPTION OF THE DRAWINGS

Other characteristics and advantages of the invention will appear better on reading the following description of preferred embodiments of the invention given as non-limiting examples. The description refers to the accompanying figures, in which:

FIG. 2A is an elevation view of a punch block situated in the panel insertion direction;

FIG. 2B is a plan view of the FIG. 2A punch block;

FIG. 3A is an elevation view of a punch block enabling a printed circuit panel to pass through;

MORE DETAILED DESCRIPTION

Figure 1:
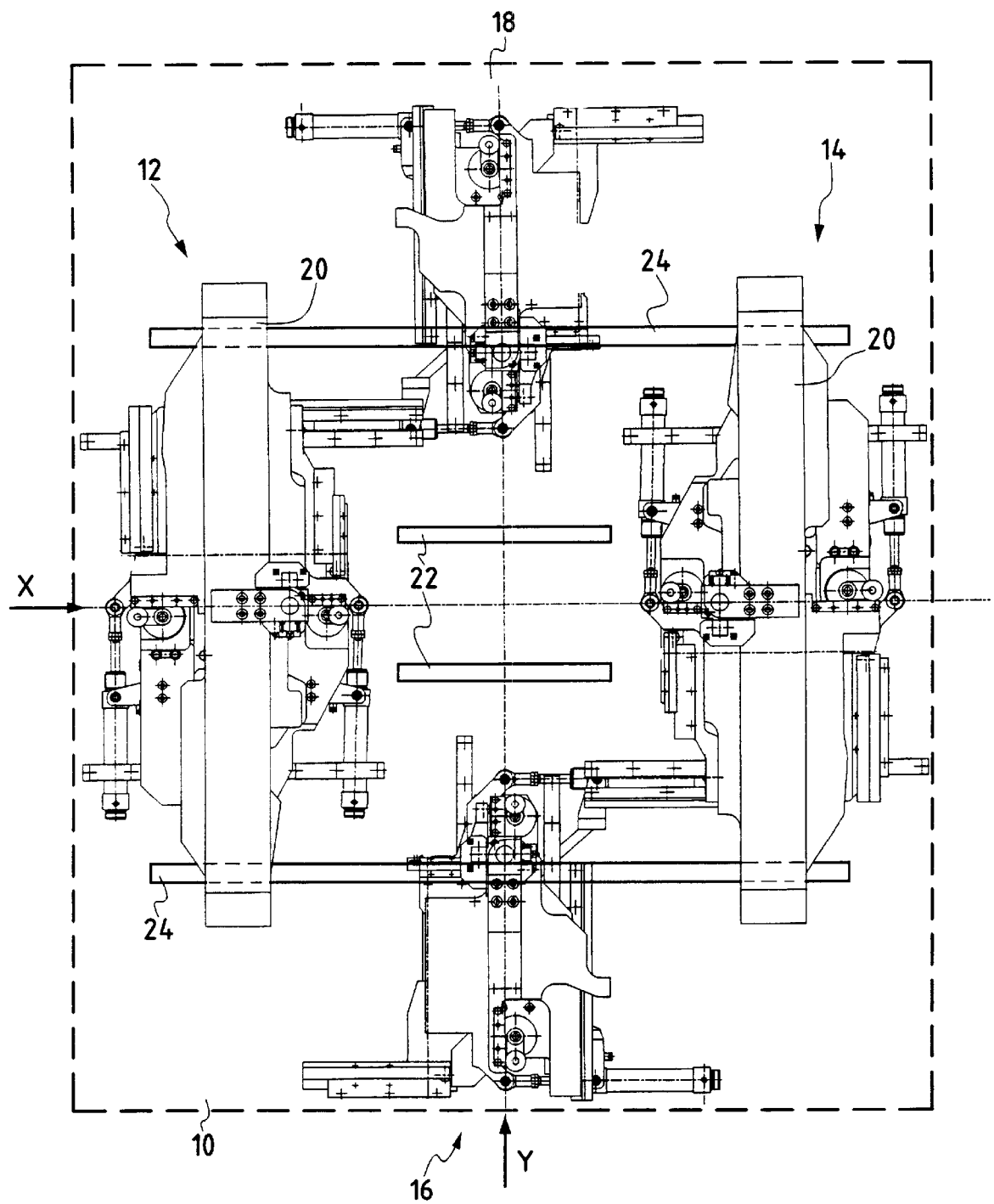
FIG. 1 is a plan view of an entire punch machine.

FIG. 1 shows all of the main elements of the punch machine. The figure shows the structure 10 of the machine and four moving punch blocks respectively referenced 12, 14, 16, and 18. The structure 10 identifies a direction X which corresponds to the direction in which printed circuit panels are inserted into the punch machine and a direction Y which is orthogonal thereto. The punch blocks 12 and 14 are connected to the structure 10 via portal- or gantry-forming structures 20 so as to allow the printed circuit panels to pass through. This figure also shows diagrammatically drive means 22 for driving the panels so as to bring them into a prepositioning position relative to the machine as a whole, and guide and holding means 24 for guiding and holding the printed circuit panels. The means 24 are essentially constituted by two assemblies enabling the edges of the printed circuit panels to be clamped in the X direction and for applying tension between these clamp elements so as to ensure that the panel for treatment is accurately plane, particularly during the punching operations. The device 24 is preferably of the type described in detail in European patent application 0 915 643 which should be considered as forming an integral part of the present description. The clamping and positioning elements 24 can be considered, to a first approximation, as being fixed relative to the structure. Nevertheless they can be adjusted in the Y direction so as to be adapted to printed circuit panels of different widths.

As already mentioned, the punch machine preferably has four punch blocks, the blocks 12 and 14 belonging to the gantry-forming structures 20 and placed along the X axis of the machine, and the punch blocks 16 and 18 which are disposed in the Y direction of the machine. Nevertheless, the machine could have other punch blocks, preferably analogous to the blocks 16 and 18 and which could be constrained to move together with the block 16 or 18 or which could be linked to move together therewith.

With reference initially to FIGS. 2A and 2B, the punch blocks 16 and 18 are described, these blocks being identical. The block 16 is described by way of example. The punch blocks are essentially constituted by a punch tool 30 which essentially comprises a punch carrier 32 and a die carrier 34, a support 36 on which the punch tool 30 is fixed, and displacement means 38 which enable the punch blocks to be moved relative to the structure 10 in the directions X and Y and in rotation about their own axes. The reference P represents the position of the printed circuit panel.

The punch tool 30 with its punch carrier 32 and its die support 34 is preferably of the type described in European patent application 0 819 504. The portion of the description of that European patent application relating to the punch block itself should be considered as forming an integral portion of the present patent application.

The displacement means 38 for moving the punch tool 30 are essentially constituted by a horizontal intermediate table 40 which is connected to the structure by means for displacement in the Y direction of the structure, and connected to the punch block support 36 by X displacement means and by means for displacement in rotation, as described below.

The Y direction displacement means interposed between the structure and the table 40 are preferably constituted by a ball screw system 42, the screw 44 being mounted to rotate relative to the structure and being rotated by a motor (not shown). The ball nut 46 is secured to the bottom face of the table 40. The displacement means also comprise two guide rails 48 and 50 secured to the structure 10 and co-operating with riders 50 and 52 secured to the bottom face of the table. The support 36 rests on the top face of the table 40 via ball systems such as 54. These ball systems enable the support 36 to move freely relative to the table 40 in a horizontal plane with very little friction. The movements of the support 36 relative to the table 40 are controlled by two eccentrics 56 and 58 which are mounted on the table 40 at two ends thereof in the Y direction. The eccentrics 56 and 58 act on two mechanical abutments 60 and 62 which are secured to the support 36. The mechanical abutments 60 and 62 are held in contact against the eccentrics by drive from actuators 64 and 66. The eccentrics 56 and 58 are rotated by motors (not shown) that serve to rotate the wheels 68 and 70.

It will be understood that each end of the support 36 can thus be moved separately relative to the intermediate table 40 in the direction X and X'. These two controls enable the punch tool 30 to be pivoted (moved in rotation) in addition to being moved in translation along the direction X.

As can be seen more clearly in FIG. 2A, each punch block is also fitted with a camera 72 which is secured to the punch block and whose optical axis points towards the structure so as to provide an image of the portion of the panel that is close to the punch block carrying the camera.

Figure 3A:
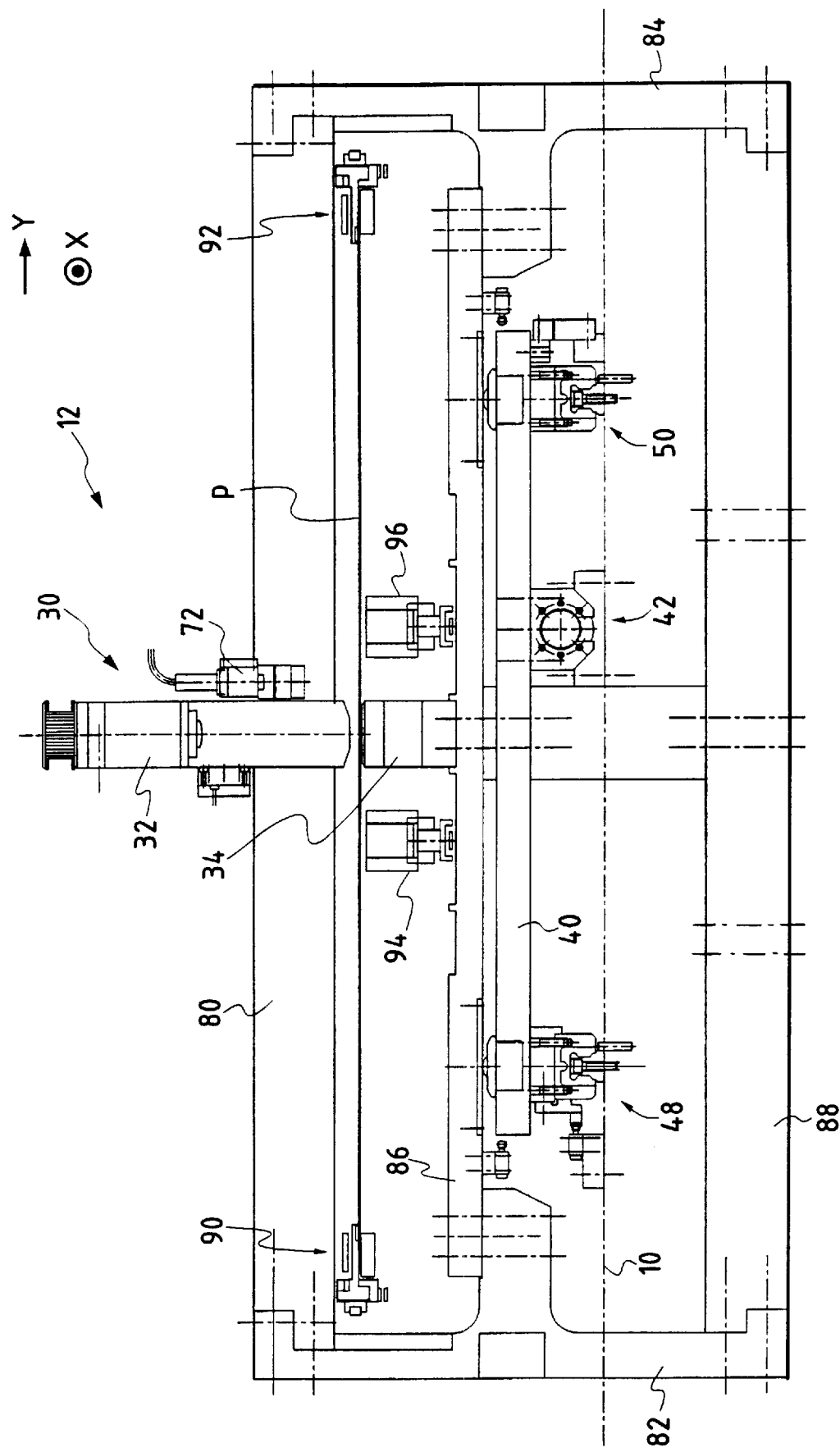
Figure 3B:
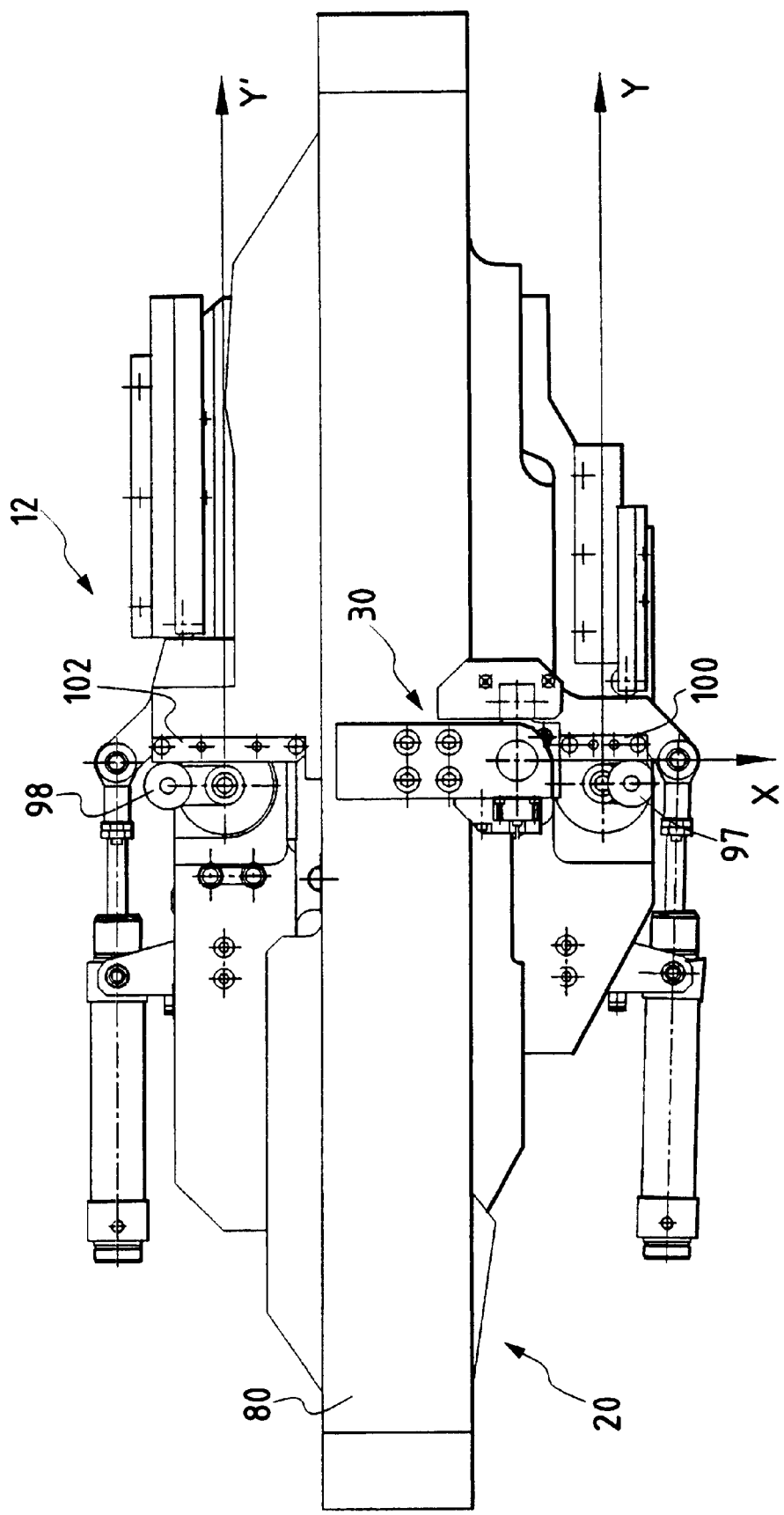
FIG. 3B is a plan view of the FIG. 3A punch block.

With reference now to FIGS. 3A and 3B, there follows a description of a preferred embodiment of the punch blocks 12 and 14 which are fitted with gantries 20. by way of example, the punch block 12 is described.

The punch block 12 is very similar to the punch block described above with reference to FIGS. 2A and 2B except for the shape of its support which is constituted by a part in the form of a gantry. More precisely, this part 20 is constituted by a top horizontal beam 80 secured to vertical uprights 82 and 84 and to an intermediate cross-member 86 and a bottom cross-member 88. Naturally, the structure 10 is sufficiently open to allow the gantry 20 to move. The punch tool 30 with its tool carrier 32 and its associated camera 72 is secured to the top beam 80. The die support 34 is secured to the intermediate beam 86 and fixed facing the tool carrier in such a manner as to leave room to allow the printed circuit panel P to pass through. In this figure, two clamp assemblies referenced 90 and 92 are shown diagrammatically to constitute the clamping system 24 of FIG. 1, these systems 90 and 92 naturally being functionally connected to the structure 10. Additional drive systems 94 and 96 are also shown corresponding to the drive device 22 of FIG. 1, these devices naturally likewise being functionally secured to the structure 10.

The support 20 is moved relative to the structure by means of a horizontal table 40' which is functionally identical to the table 40. Movement in the X direction of the table 40' is obtained by means of a ball screw system 42 identical to that for the punch block 16. Similarly, the intermediate table 40' is guided during this movement by rails that are secured to the structure 10 and that are of the same kind as the rails 48 and 50 of the punch block 16. The gantry-forming structure 20 is supported by the intermediate table 40' via ball systems of the same kind as the ball systems 54 of the punch block 16 so that the gantry 20 can move freely in a horizontal plane relative to the table 40'. More precisely, the ball systems 54 are interposed between the intermediate table 40' and the plate 86.

As can be seen more clearly in FIG. 3B, Y direction movements and movements in rotation of the gantry 20 are obtained using systems identical to those used for the punch block 16. These systems are constituted by two eccentrics 96 and 98 co-operating with abutments 100 and 102 secured to the gantry 20, these abutments being respectively located at opposite ends of the gantry in the X direction. The eccentrics 96 and 98 thus enable the ends of the gantry 20 to be moved separately in the X direction, these movements being performed in the directions Y and Y', thereby enabling the angle at which the gantry is pivoted and thus the angle of the punch tool to be adjusted.

It should also be emphasized that the presence of two gantries makes it possible to reach any point on the panel without the punch tool being significantly cantilevered-out which could affect the precision with which it is positioned.

Figure 4:
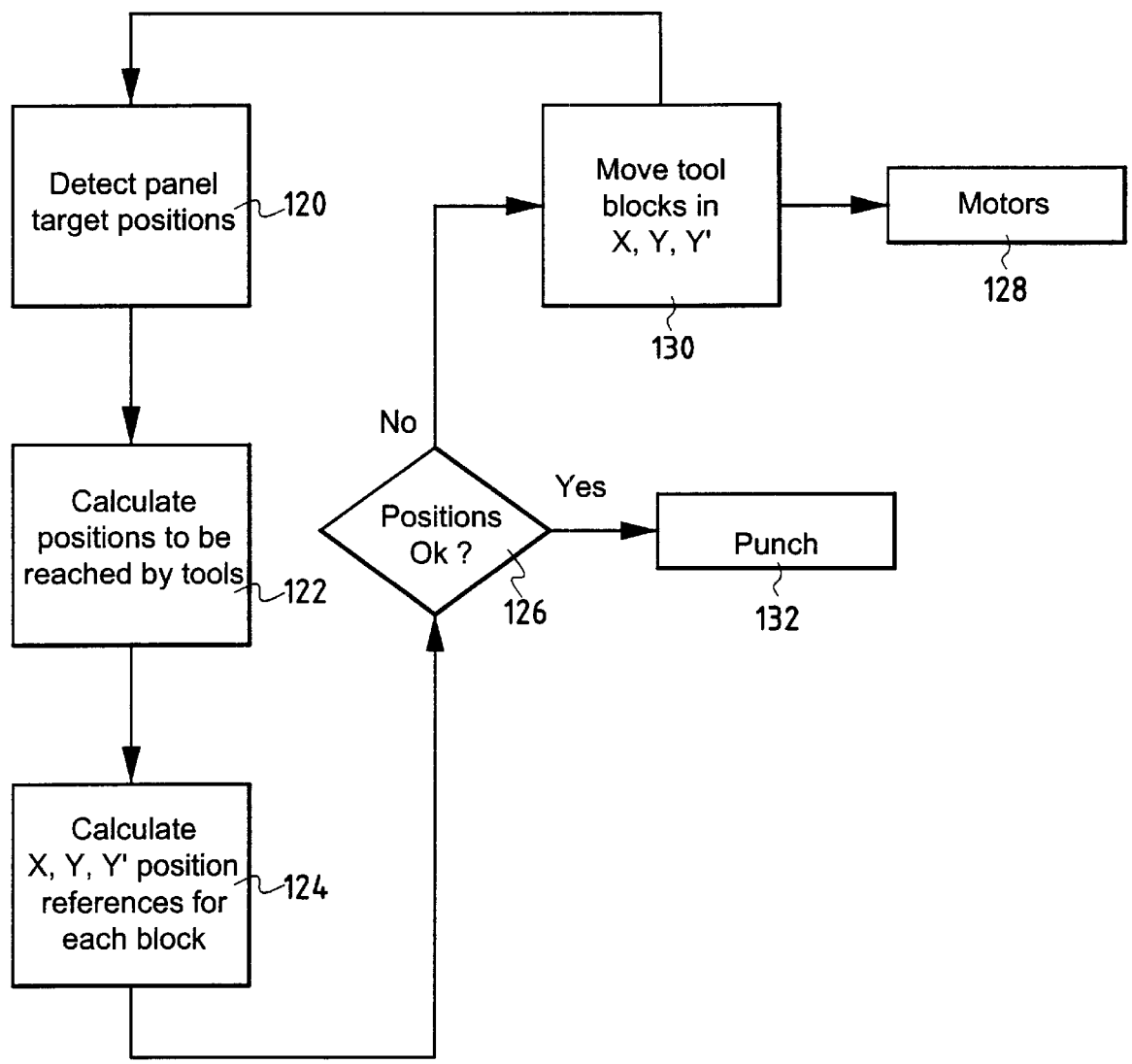
FIG. 4 is a flow chart showing the final positioning operations for each punch block.

With reference to FIG. 4, there follows a description of how the punch machine operates. After the printed circuit panel has been brought to the structure and prevented from moving by the clamp systems 24, the cameras carried by the various punch blocks operate in a step 120 to detect the positions of targets on the panel which correspond to the various punch blocks. In step 122, the processor circuit associated with the machine calculates, for each punch block, the positions to be reached by the punch tool. On the basis of this information, in step 124, precision references are calculated for the punch block in question in the X and Y directions and in rotation. These positions are compared in step 126 with the actual position of the punch block, which position is supplied by precision sensors of the block that are not described in detail. If the positions of all of the punch tools are correct, then the punches of the various blocks are caused to be actuated in step 128. If the positions are not all correct, then in step 130, the various X, Y, and rotation actuators for each punch block are actuated in step 132. The new position is compared with the position calculated for the punch blocks concerned and the process is repeated until each block is in the correct position.

In a variant, it is possible to provide for position errors of the punch blocks to be detected by a set of cameras connected to the structure, which would then replace the cameras carried by the punch blocks.

Furthermore, in some cases, it can be advantageous for a punch block to have a plurality of punch tools. For example, the punch blocks 12 and 14 could have two additional punch tools disposed on either side of the tool 30 on the cross-members 80 and 86.

In the preferred embodiment in which each punch block carries its own camera, it is possible to implement automatic correction of instructions governing the displacement of the punch block.

After each hole has been made by a given punch block, its camera is controlled to take an image of the hole actually made and of the mark on the panel indicating the ideal position for that hole. On the basis of this image, the central calculator of the machine determines the offset and calculates the mean value of the offsets for each punch block. This mean offset value is used to correct the displacement instructions applied to the punch block on the basis of the position error detected by the camera when the punch block in question is making a subsequent hole.

What is claimed is:

1. A machine for punching a panel on which the position of each hole to be made is identified by a mark, at least some of the holes being capable of having an outline that is not circular, the machine comprising:

a structure for receiving said panel, said structure presenting X and Y directions;

transfer means for bringing a panel onto said structure in the X direction;

means for holding said panel relative to said structure;

at least four punch blocks disposed on the structure, each punch block comprising least one punch carrier tool, at least one die carrier assembly, and a support, wherein supports for a first two of said blocks are in the form of a gantry to enable said panels to travel in the X direction between said punch carrier tool and said die carrier assembly of said first two punch blocks, and supports for a second two of the punch blocks are not in the form of a gantry;

displacement means for separately moving each punch block relative to said structure in the X and Y directions and in rotation;

optical comparator means for comparing the position of each punch block with the corresponding mark and for generating X and Y and rotation position error information relating to each punch block; and control means for separately controlling the displacement means in response to the position error information.

2. A punch machine according to claim 1, wherein said optical comparator means comprise a camera secured to each punch block.

3. A punch machine according to claim 1, wherein said displacement means for each of said first two punch blocks comprise an intermediate table, means for displacing said intermediate table relative to said structure in the X direction, and two distinct means for displacing two distinct zones of said gantry-forming support relative to said intermediate table in the Y direction.

4. A machine according to claim 1, wherein said displacement means of each of said second two punch blocks comprise an intermediate table, means for displacing said table relative to said structure in the Y direction, and two distinct means for displacing two distinct zones of said tool block support relative to said intermediate table in the X direction.

5. A punch machine according to claim 3, wherein said means for displacing the intermediate table relative to the structure comprise a ball screw system disposed in the X direction for the punch blocks associated with gantry-forming supports and in the Y direction for the punch blocks not associated with gantry-forming supports, and guide rails secured to the structure and parallel to said screws.

6. A punch machine according to claim 3, further comprising ball systems interposed between the top face of each intermediate table and the bottom face of each support.

7. A machine according to claim 2, further comprising:
  means active after a hole has been made by a punch block to control the camera to measure the position offset between the hole actually made and the mark on the panel;
  means for calculating and storing the mean of said successive offsets for a given punch block; and
  means for correcting the instructions transmitted to the displacement means associated with the punch block as a function of said mean offset.

8. A punch machine according to claim 4, wherein said means for displacing the intermediate table relative to the structure comprise a ball screw system disposed in the X direction for the punch blocks associated with gantry-forming supports and in the Y direction for the punch blocks not associated with gantry-forming supports, and guide rails secured to the structure and parallel to said screws.

9. A punch machine according to claim 4, further comprising ball systems interposed between the top face of each intermediate table and the bottom face of each support.

10. A machine for punching a panel on which the position of each hole to be made is identified by a mark, at least some of the holes being capable of having an outline that is not circular, the machine comprising:
  a structure for receiving said panel, said structure presenting X and Y directions;
  transfer means for bringing a panel onto said structure in the X direction;
  means for holding said panel relative to said structure;
  at least four punch blocks disposed on the structure, each punch block comprising at least one punch carrier tool, at least one die carrier assembly, and a support, wherein supports for a first two of said blocks are in the form of a gantry to enable said panel to travel in the X direction between said punch carrier tool and said die carrier assembly of said first two punch blocks, and supports for a second two of the punch blocks are not in the form of a gantry;
  displacement means for separately moving each punch block relative to said structure in the X and Y directions and in rotation, wherein the displacement means comprises means for moving the punch block in a selected one of the X and Y direction and means for separately moving one of two ends of the punch block in a direction opposite to the selected one of the X and Y directions;
  optical comparator means for comparing the position of each punch block with the corresponding mark and for generating X and Y and rotation position error information relating to each punch block; and
  control means for separately controlling the displacement means in response to the position error information.

* * * * *